US011245263B2

(12) United States Patent
Ma et al.

(10) Patent No.: US 11,245,263 B2
(45) Date of Patent: Feb. 8, 2022

(54) SYSTEM AND METHOD OF LOCATING OSCILLATION SOURCES OF WIND POWER INTEGRATED SYSTEM BASED ON ENERGY SPECTRUMS

(71) Applicant: North China Electric Power University, Beijing (CN)

(72) Inventors: Jing Ma, Beijing (CN); Dong Zhao, Beijing (CN); Yuanpei Gu, Beijing (CN); Yaqi Shen, Beijing (CN)

(73) Assignee: North China Electric Power University, Beijing (CN)

( * ) Notice: Subject to any disclaimer, the term of this patent is extended or adjusted under 35 U.S.C. 154(b) by 0 days.

(21) Appl. No.: 16/891,943

(22) Filed: Jun. 3, 2020

(65) Prior Publication Data
US 2021/0036518 A1 Feb. 4, 2021

(30) Foreign Application Priority Data
Jul. 30, 2019 (CN) .......................... 201910694996.3

(51) Int. Cl.
H02J 3/38 (2006.01)
G01R 31/08 (2020.01)
(Continued)

(52) U.S. Cl.
CPC ............ *H02J 3/381* (2013.01); *G01R 31/086* (2013.01); *H02J 3/24* (2013.01); *H03L 7/099* (2013.01); *H03L 7/18* (2013.01)

(58) Field of Classification Search
CPC .. H02J 3/381; H02J 3/24; H02J 3/0012; H02J 2300/28; G01R 31/086; G01R 21/133;
(Continued)

(56) References Cited

U.S. PATENT DOCUMENTS 8,471,610 B2 * 6/2013 Sun ........................... H03L 7/08
327/156
10,063,161 B2 * 8/2018 Li ............................. F03D 17/00
(Continued)

FOREIGN PATENT DOCUMENTS

CN 103901882 A 7/2014
CN 109217362 A 1/2019
(Continued)

OTHER PUBLICATIONS

First Office Action from The State Intellectual Property Office of People's Republic of China in Chinese Application No. 201910694996. 3, dated Mar. 25, 2020 (18 pages).
(Continued)

*Primary Examiner* — Jean B Corrielus
(74) *Attorney, Agent, or Firm* — Benesch, Friedlander, Coplan & Aronoff LLP

(57) ABSTRACT

The present application proposes a method of locating oscillation sources of wind power integrated system based on energy spectrums. The method include: collecting information of voltage and current at the terminal of each generator and obtaining a dynamic energy curve of each generator over time; choosing the generators whose curve shows an upward trend in the dynamic energy over time curve into alternative generators; obtaining and processing energy spectrums of synchronous generator, DFIG with PLL, and/or an analogical energy spectrum of DFIG with virtual inertia among the alternative generators; selecting generator with maximum proportion of dominant oscillation mode as an oscillation source reference generator; and calculating the similarity coefficients between energy spectrums of each remaining candidate generator and the oscillation source reference generator, determining the oscillation source generators.

10 Claims, 8 Drawing Sheets

(51) Int. Cl.
  *H02J 3/24* (2006.01)
  *H03L 7/099* (2006.01)
  *H03L 7/18* (2006.01)
(58) Field of Classification Search
  CPC . H03L 7/099; H03L 7/18; Y02E 10/76; F03D 17/00; G06N 5/02; H02P 9/007
  See application file for complete search history.

(56) References Cited

U.S. PATENT DOCUMENTS

| 10,461,538 | B2* | 10/2019 | Yamazaki | H02J 3/24 |
| 2019/0006912 | A1 | 1/2019 | Zhu et al. | |
| 2021/0036518 | A1* | 2/2021 | Ma | H03L 7/18 |

FOREIGN PATENT DOCUMENTS

| CN | 109283427 A | 1/2019 |
| CN | 110011357 A | 7/2019 |

OTHER PUBLICATIONS

Search Report issued by The State Intellectual Property Office of People's Republic of China in Chinese Application No. 201910694996.3, dated Mar. 17, 2020 (1 page).
Xiaoqiang, X., Dissertation for the Master Degree in Engineering: "Study on Mechanism and Control Strategy of Sub-synchronous Oscillation Caused by DFIG-based Wind Turbines Connected to Grid," North China Electric Power University, Mar. 2019 (3 pages) (abstract only).
J. Ma, Y. Shen, and Y. Zhang, "Dynamic characteristics of DFIG frequency oscillation of wind turbines with virtual inertia control," J. Eng., vol. 2017, No. 13, pp. 2525-2529, 2017.
W. Du, J. Bi, J. Cao, and H. F. Wang, "A method to examine the impact of grid connection of the DFIGs on power system electromechanical oscillation modes," IEEE Trans. Power Syst., vol. 31, No. 5, pp. 3775-3784, Sep. 2016.
W. Du, X. Chen, and H. F. Wang, "Strong dynamic interactions of grid-connected DFIGs with power systems caused by modal coupling," IEEE Trans. Power Syst., vol. 32, No. 6, pp. 4386-4397, Nov. 2017.
S. Yu, T. Fernando, K. Emami, and H. H. Iu, "Dynamic state estimation based control strategy for DFIG wind turbine connected to complex power systems," IEEE Trans. Power Syst., vol. 32, No. 2, pp. 1272-1281, Mar. 2017.
J. Ma, P. Zhang, H.-J. Fu, B. Bo, and Z.-Y. Dong, "Application of pha-sor measurement unit on locating disturbance source for low-frequency oscillation," IEEE Trans. Smart Grid, vol. 1, No. 3, pp. 340-346, Dec. 2010.
D.-I. Kim, A. White, and Y.-J. Shin, "PMU-based event localization technique for wide-area power system," IEEE Trans. Power Syst., vol. 33, No. 6, pp. 5875-5883, Nov. 2018.
H. Zamani, M. Karimi-Ghartemani, and M. Mojiri, "Analysis of power system oscillations from PMU data using an EPLL-based approach," IEEE Trans. Instrum. Meas., vol. 67, No. 2, pp. 307-316, Feb. 2018.
H. Ye, Y. Liu, P. Zhang, and Z. Du, "Analysis and detection of forced oscillation in power system," IEEE Trans. Power Syst., vol. 32, No. 2, pp. 1149-1160, Mar. 2017.
Y. Liao, Z. Liu, H. Zhang, and B. Wen, "Low-frequency stability analysis of single-phase system with dq-frame impedance approach—Part II: Stability and frequency analysis," IEEE Trans. Ind. Appl., vol. 54, No. 5, pp. 5012-5024, Sep./Oct. 2018.
G. Ledwich and E. Palmer, "Energy function for power systems with transmission losses," IEEE Trans. Power Syst., vol. 12, No. 2, pp. 785-790, May 1997.
L. Chen, Y. Min, and W. Hu, "An energy-based method for location of power system oscillation source," IEEE Trans. Power Syst., vol. 28, No. 2, pp. 828-836, May 2013.
S. Feng, B. Zheng, P. Jiang, and J. Lei, "A two-level forced oscillations source location method based on phasor and energy analysis," IEEE Access, vol. 6, p. 44 318-44 327, 2018.
Y. Yu, S. Grijalva, J. J. Thomas, L. Xiong, P. Ju, and Y. Min, "Oscillation energy analysis of inter-area low-frequency oscillations in power systems," IEEE Trans. Power Syst., vol. 31, No. 2, pp. 1195-1203, Mar. 2016.
Y. Shu, X. Zhou, and W. Li, "Analysis of low frequency oscillation and source location in power systems," CSEE J. Power Energy Syst., vol. 4, No. 1, pp. 58-66, Mar. 2018.
A. K. Gupta, K. Verma, and K. R. Niazi, "Dynamic impact analysis of DFIG-based wind turbine generators on low-frequency oscillations in power system," IET Gener., Transmiss. Distrib., vol. 11, No. 18, pp. 4500-4510, 2017.
Y.-H. Moon, B.-H. Cho, Y.-H. Lee, and H.-S. Hong, "Energy conservation law and its application for the direct energy method of power system stability," in Proc. IEEE Power Eng. Soc. Winter Meeting, New York, NY, USA, 1999, vol. 1, pp. 695-700.
S. C. Müller, U. Häger, and C. Rehtanz, "A multiagent system for adaptive power flow control in electrical transmission systems," IEEE Trans. Ind. Inform., vol. 10, No. 4, pp. 2290-2299, Nov. 2014.

* cited by examiner step 1: collecting the information of voltage and current at the output terminal of each generator in the system, and obtain a dynamic energy curve of each generator over time;

step 2: choosing the generators whose curve shows an upward trend in the dynamic energy curve over time into alternative generators;

step 3: obtaining energy spectrum of synchronous generators, DFIGs with a phase-locked loop, and/or an analogical energy spectrum of DFIGs with virtual inertia among the alternative generators;

step 4: standardizing the amplitude of the energy spectrum and/or the analogical energy spectrum; The generator with the maximum proportion of dominant oscillation mode is selected as a oscillation source reference generator;

step 5: calculating the similarity coefficients of energy spectrum between each remaining alternative generator and the oscillation source reference generator in the ±0.3 Hz frequency band of the dominant mode of the oscillation source reference generator; Determine the oscillation source generators based on the similarity coefficients.

Fig.1

SYSTEM AND METHOD OF LOCATING OSCILLATION SOURCES OF WIND POWER INTEGRATED SYSTEM BASED ON ENERGY SPECTRUMS

CROSS-REFERENCE TO RELATED APPLICATIONS

This application claims priority to Chinese Patent Application No. 201910694996.3, filed on Jul. 30, 2019, which is hereby incorporated by reference in its entirety.

TECHNICAL FIELD

The application relates to the technical field of wind power generation system, and particularly relates to a system and method of locating oscillation sources of wind power integrated system based on energy spectrums.

BACKGROUND

As an additional control link of DFIG (Doubly-fed induction generator), virtual inertia may improve the inertia and frequency response characteristics of a system to some extent. However, it also opens the channel for the interaction of power between DFIG and system when disturbance occurs, which strengthens the coupling effect between DFIG and power grid. The virtual inertia will lower damping level of wind power integrated system and cause the oscillation mode where DFIG participates to exhibit weak damping, thus the system may easily oscillate, diverge and go unstable after being disturbed. On the other hand, apart from the dominant oscillation mode, other oscillation modes with weak damping may also be excited during the system oscillation process, and the coupling between multiple oscillation modes will cause the frequency components in the system oscillation waveform to be more complicated, making it difficult to locate the dominant oscillation source generators accurately. Therefore, in order to guarantee the stable level of the disturbed wind power integrated system, accurately locating oscillation source generators in the dominant oscillation mode has become a key issue to be solved urgently.

At present, the location of low-frequency oscillation disturbance sources in power system has gradually become a hot topic for many experts and scholars at home and abroad. However, existing studies on the location of oscillation source are mainly focused on traditional power system, and none has been taken into account the coupling effect of multiple oscillation modes generated by disturbance of wind power integrated system with virtual inertia. Thus, they cannot distinguish between oscillation source generators in the dominant oscillation mode and non-dominant oscillation modes, and cannot accurately locate the oscillation sources of the system.

SUMMARY

Based on above analysis, the application aims to propose a system and method of locating the oscillation sources of wind power integrated system based on energy spectrums. It is used to solve the problem that it is difficult to accurately locate the oscillation source generators when the system is stimulated with multiple oscillation modes after being disturbed.

The object of the present application is mainly realized by the following technical scheme:

On the one hand, a method of locating the oscillation sources of wind power integrated system based on energy spectrums is proposed, which includes the following steps:

step 1: collecting information of voltage and current at an output terminal of each of a plurality of generators in the system, and obtain a dynamic energy curve of each generator over time;

step 2: choosing generators whose curves show an upward trend in the dynamic energy curve over time into alternative generators;

step 3: obtaining energy spectrums of synchronous generator, DFIG with a phase-locked loop, and/or analogical energy spectrum of DFIG with virtual inertia among the alternative generators;

step 4: standarizing the amplitudes of the energy spectrums and/or the analogical energy spectrum, wherein generator with maximum proportion of dominant oscillation mode is selected as an oscillation source reference generator; and step 5: calculating the similarity coefficients between energy spectrums of each remaining alternative generator and the oscillation source reference generator in the ±0.3 Hz frequency band of the dominant oscillation mode of the oscillation source reference generator; determining the oscillation source generators based on the similarity coefficients.

Further, in the step 1, calculating the dynamic energy of each generator by the following formula in order to obtain the dynamic energy curve of each generator over time:

$$W = \int \mathrm{Im}((-I^*_G)dU) = \int -P_e d\delta - \int I_d \dot{U}_q + \int I_q \dot{U}_d$$

Where $P_e$ is the active power output by the each generator; $\delta$ is the angular difference between xy coordinate system and dq coordinate system; when one of the plurality of the generators is a synchronous generator, $\delta$ represents a power angle of a the synchronous generator; $\delta$ represents a phase-locked angle $\delta_{pll}$ of PLL, when the generator is a DFIG with PLL (Phase-locked loop); $\delta$ represents the phase-locked angle $\delta_{pll}$ of PLL, when one of the plurality of the generators is a DFIG with virtual inertia; $U_d$, $U_q$, $I_d$ and $I_q$ are respectively the d-axis and q-axis components of the voltage and current output at the terminal of each generator.

Further, the step 3 includes: through Fourier decomposition for the dynamic energy of each generator in the time domain, obtaining amplitudes $A(k)$ of the energy spectrum corresponding to frequency component $f(k)$, where $k=1, 2, 3, 4, \ldots, N/2$, and N is a length of a discrete signal; the $A(k)$ is the amplitudes of energy spectrums for the synchronous generator and the DFIG with PLL; the amplitudes of the analogical energy spectrum for the DFIG with virtual inertia is $A(k)/f^2(k)$.

Further, which also includes: after normalizing the amplitudes of the energy spectrums and/or the analogical energy spectrum, standardizing the amplitudes of the energy spectrums and/or the analogical energy spectrum; wherein the calculation formula of the normalization process is:

$$S'(k) = \frac{S(k) - \overline{S}(k)}{\sqrt{\sum_{i=1}^{N/2} \frac{2}{N}[S_i(k) - \overline{S}(k)]^2}}$$

where $S(k)$ is the amplitudes of energy spectrum corresponding to each frequency; the amplitudes of energy spectrums of the synchronous generators and the DFIG with PLL are S(k)=A(k); the amplitudes of analogical energy spectrum of the DFIG with virtual inertia are S(k)=A(k)/f(k); S(k) is the average value of the amplitudes of energy spectrums; N is the number of frequencies; S'(k) is the normalized amplitudes of energy spectrums.

Further, in the step 4, standardizing all the normalized amplitudes of energy spectrums and/or the amplitudes of the analogical energy spectrum in the 0.1 Hz-2.5 Hz, which can obtain the ratio of the amplitudes of the energy spectrums of the oscillation modal and/or the amplitudes of analogical energy spectrum of each generator to the sum of the amplitudes of all the energy spectrums of the corresponding generators; wherein a generator with the largest proportion is the oscillation source reference generator.

Further, in the step 5, according to the following formula to calculate the similarity coefficients between energy spectrums of each remaining alternative generator and the oscillation source reference generator:

$$r(X, y) = \frac{n\Sigma xy - \Sigma x \Sigma y}{\sqrt{n\Sigma x^2 - (\Sigma x)^2} \cdot \sqrt{n\Sigma y^2 - (\Sigma y)^2}}$$

where x, y are the energy spectrum data of the two generators in the ±0.3 Hz frequency band of the dominant oscillation mode; r is the calculated similarity coefficient.

Further, in the step 5, when the similarity coefficient between energy spectrums of a generator and the oscillation source reference generator is greater than or equal to 0.7±0.05, the generator is determined as the oscillation source generator.

On the other hand, a system of locating the oscillation sources of wind power integrated system based on energy spectrums is proposed, which includes sensors, a first processor, a second processor and a result output terminal; the sensors collect information of voltage and current at the output terminal of each generator in the system and transfer it to the first processor; the first processor receives the data transmitted by the sensors, and calculates a dynamic energy change trend of each generator over time and transfers it to the second processor; the second processor receives the dynamic energy data of the output terminal of each generator, calculates the energy spectrums and locates the system oscillation sources by comparing the similarity between the energy spectrums of each generator and the oscillation source reference generator; and the result output is used for outputting a dominant oscillation mode and corresponding system oscillation source generators.

Further, the first processor calculates the dynamic energy change curve of each generator over time by the following formula:

$$W = \int \mathrm{Im}((-I^*_G)dU) = \int -P_e d\delta - \int I_d \dot{U}_q + \int I_q \dot{U}_d$$

Where $P_e$ is the active power output by the each generator; $\delta$ is the angular difference between xy coordinate system and dq coordinate system; when one of the plurality of generators is a synchronous generator, $\delta$ represents the power angle of a the synchronous generator; $\delta$ represents the phase-locked angle $\delta_{pll}$ of PLL, when one of the plurality of generators is a DFIG with PLL; $\delta$ represents the phase-locked angle $\delta_{pll}$ of PLL, when one of the plurality of generators is a DFIG with virtual inertia; $U_d$, $U_q$, $I_d$ and $I_q$ are respectively the d-axis and q-axis components of the voltage and current at the output terminal of each generator.

Further, the working process of the second processor is as follows:

choosing the generators whose curves show upward trend in the dynamic energy curves over time into alternative generators; obtaining energy spectrums of synchronous generator, DFIG with the phase-locked loop, and/or an analogical energy spectrum of DFIG with virtual inertia among the alternative generators; standardizing the amplitudes of the energy spectrums and/or the analogical energy spectrum; wherein a generator with the maximum proportion of dominant oscillation mode is selected as an oscillation source reference generator; calculating the similarity coefficients between energy spectrums of each remaining alternative generator and the oscillation source reference generator in the ±0.3 Hz frequency band of the dominant oscillation mode of the oscillation source reference generator; determining the oscillation source generators based on the similarity coefficients.

Compared with the present technologies, the application has at least one of the following beneficial effects:

1) The proposed method of locating the oscillation sources of wind power integrated system based on energy spectrums can monitor in real time the dynamic energy change curve of each generator over time by measuring the voltage and current information at the terminal of each generator in the system, preliminary identify the alternative generators and realize online evaluation of system damping and online tracking of conduction path of oscillation components. By comparing the similarity of the dynamic energy spectrums of different terminals of generators in the vicinity of the oscillation mode, it can avoid the influence of non-dominant oscillation mode on the location of the oscillation sources, and realize the rapid and accurate identification of the dominant oscillation source generators under complex system conditions, which is helpful to isolate the fault generator in time, restrain the development and divergence of oscillation, and ensure the safe and stable operation of the system.

2) In the proposed system of locating oscillation sources of wind power integrated system based on energy spectrums, the proposed second processor receives the dynamic energy data at the output port of each generator, calculates the energy spectrums and compares the similarity between the energy spectrums of each generator and the oscillation source reference generator, which can quickly and accurately identify the system oscillation sources, realize the online location of the oscillation sources, and provide a strong guarantee for the stable and safe operation of the system.

In the application, the above technical schemes can be combined with each other to realize more preferred combination schemes. Other features and advantages of the application will be described in a subsequent specification, and some of the advantages may become apparent from the specification or be understood by implementing the application. The object and other advantages of the application can be realized and obtained through the contents specially pointed out in the specification and the drawings.

BRIEF DESCRIPTION OF DRAWINGS

The attached figures are only for the purpose of illustrating specific embodiments, and are not considered to be a limitation of the application. In the whole figures, the same reference symbols represent the same parts.

FIG. 1 is a flow chart of a method of locating the oscillation sources of wind power integrated system based on energy spectrums in the embodiment.

DESCRIPTION OF EMBODIMENTS

The preferred embodiments of the application will be described below in combination with the attached figures in detail, where the attached figures form part of the application and, together with the embodiments of the application, are used to explain the principles of the application, not to define the scope of the application.

The application proposes a method of locating the oscillation sources of wind power integrated system based on energy spectrums. This method is based on the theoretical support that the spectral characteristics of the oscillation source generators are that the amplitude of dominant oscillation mode is much larger than that of the non-dominant oscillation mode. In order to facilitate the understanding of the technical proposal of the application, the following theoretical analysis is used to elaborate in detail that the spectrum characteristics of the oscillation source generators are that the amplitude of the dominant oscillation mode is much larger than that of the non-dominant oscillation mode. The specific analysis process is as follows:

step S1: a dynamic energy model of DFIGs containing virtual inertia and phase locked loop (PLL) control modules is constructed.

Figure 2:
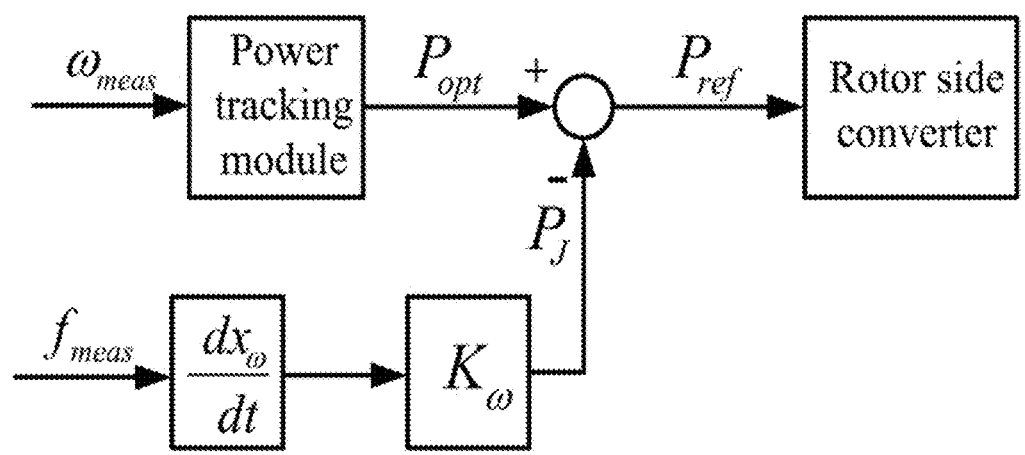
FIG. 2 is a phase-locked loop model in the embodiment.

The dynamic equations of PLL can be expressed as:

$$\dot{x}_{PLL} = -u_{sd}$$

$$\dot{\delta}_{PLL} = \omega_{s\_PLL} - \omega_n$$

$$\omega_{s\_PLL} = K_{I\_PLL} x_{PLL} - K_{P\_PLL} u_{sd}.$$

Where $x_{pll}$ is an intermediate variable introduced, $u_{sd}$ is DFIG stator d-axis voltage, $\delta_{PLL}$ represents the angle of the observed stator voltage vector leading the x-axis in the xy coordinate, $\omega_{s\_PLL}$ is the rotating angular speed of dq coordinate system measured by PLL, $\omega_n$ is the grid frequency, $K_I$ and $K_P$ are PLL PI controller parameters, as shown in FIG. 2.

The virtual inertia control model can be expressed as:

$$\dot{x}_\omega = f_{meas}$$

$$f_{meas} = \frac{\omega_{s\_PLL}}{2\pi}.$$

Where $x_\omega$ is the intermediate variable introduced, $f_{meas}$ is the value of system frequency measured by PLL, which is $$f_{meas} = \frac{\omega_{s\_PLL}}{2\pi}.$$

According to the deviation of system frequency, the variation of active power released by virtual inertia control $\Delta P_{VI}$ can be expressed as:

$$\Delta P_{VI} = -K_\omega \frac{d\Delta f}{dt} = -\frac{K_\omega}{2\pi} \frac{d^2 \Delta \delta_{pll}}{dt^2}.$$

Where $K_\omega$ is the proportion parameter of virtual inertia control, and $K_\omega > 0$.

After virtual inertia control is introduced, the reference value of active power of rotor-side converter $P_{ref}$ will be adjusted according to the variation in system frequency. The variation of DFIG stator-side active power caused by virtual inertia $\Delta P_s$ is:

$$\Delta P_s = \Delta P_{ref} = \Delta P_{VI} = -\frac{K_\omega}{2\pi} \frac{d^2 \Delta \delta_{pll}}{dt^2}.$$

The energy function of the system can be constructed based on the node current equation. The energy of the system can be obtained by integrating node voltage $U_B$, generator injection current $I_G$ and load current $I_L$ along system trajectory:

$$W = \int I_m (YU_B - I_G + I_L)^{*T} dU_B) \quad (1).$$

Where Y is admittance matrix of the system, $U_B$ is the column vector of bus voltage. $I_G$ and $I_L$ are respectively the column vectors of generator node injection current and load node injection current. $I_m$ represents extracting the imaginary part of a complex.

Take the energy of the generator from the energy of the system, and apply dq transformation for the node voltage and node current, and then combine the generator rotor motion equation, to obtain the expression of DFIG terminal dynamic energy:

$$W = \int Im((-I^*_G)dU) = \int -P_e d\delta - \int I_d \dot{U}_q + \int I_q \dot{U}_d \quad (2)$$

Where $P_e$ is the active power output by the each generator; $\delta$ is the angular difference between xy coordinate system and dq coordinate system; when one of the plurality of generators is a synchronous generator, $\delta$ represents the power angle of the synchronous generator; $\delta$ represents the phase-locked angle $\delta_{pll}$ of PLL, when one of the plurality of generators is a DFIG with PLL; $\delta$ presents the phase-locked angle $\delta_{pll}$ of PLL, when one of the plurality of generators is a DFIG with virtual inertia; $U_d$, $U_q$, $I_d$ and $I_q$ are respectively the d-axis and q-axis components of the voltage and current at the output terminal of each generator.

Considering that electrical variables measured directly contain steady-state components irrelevant to oscillation, the dynamic energy obtained by equation (1) cannot accurately reflect the accumulation process of energy during oscillation. To filter out the effect of steady-state component of the energy, the variation values of electrical variables are used to calculate the dynamic energy generated during oscillation, i.e.

$$\Delta W = \int -\Delta P_e d\Delta\delta - \int \Delta I_d \Delta \dot{U}_q + \int \Delta I_q \Delta \dot{U}_q \quad (3)$$

The dynamic energy of the terminal of each generator in the equation (3) can be divided into two parts:

$$\Delta W_1 = -\int \Delta P_e d\Delta \delta_{pll} \quad (4).$$

$$\Delta W_2 = -\int \Delta I_d \Delta \dot{U}_q + \int \Delta I_q \Delta \overline{U}_d \quad (5)$$

Where $\Delta W_1$ is the energy generated by PLL, and $\Delta W_2$ is the energy generated by grid-side line.

The virtual inertia uses frequency output by PLL as its input, and it provides support for system inertia by changing the active power output by the stator. Thus, virtual inertia mainly affects $\Delta W_1$ in the equation (4). Substituting the active power change with virtual inertia into equation (4), the expression of $\Delta W_1$ containing virtual inertia can be obtained:

$$\Delta W_1 = -\int \left(\Delta P_e - \frac{K_\omega}{2\pi}\frac{d^2\Delta\delta_{pll}}{dt^2}\right)d\Delta\delta_{pll}. \tag{6}$$

$\Delta W_2$ in the equation (5) is mainly determined by transmission line parameters. Suppose low frequency oscillation with frequency $\omega_d$ occurs in DFIG integrated system, and the amplitude of current oscillation component is $I_n$, the d-axis and q-axis components of current at the grid-connecting point of DFIG can be expressed as:

$$\Delta i_d = I_n \cos((\omega_s-\omega_d)t+\varphi)$$

$$\Delta i_q = -I_n \sin((\omega_s-\omega_d)t+\omega) \tag{7}$$

The relationship between d-axis and q-axis components of voltage and current at the grid-connecting point is:

$$U_d = L\frac{di_d}{dt} - \omega L i_q \tag{8}$$

$$U_q = L\frac{di_q}{dt} + \omega L i_d.$$

Substituting the equation (7) and the equation (8) into the equation (5), so that:

$$\Delta W_2 = -\tfrac{1}{2}\omega L I_n^2 \tag{9}$$

According to equation (9), the dynamic energy generated by line is a constant value without any periodical component, and unaffected by the rising and falling trends of dynamic energy. Thus, the dynamic energy of DFIG is mainly affected by PLL and virtual inertia during low frequency oscillation.

Step S2: According to the dynamic energy expression of DFIG with virtual inertia obtained by equation (6), the energy spectrums of DFIGs with virtual inertia and PLL as an oscillation source and a non-oscillation source are derived, and their energy spectrum characteristics are analyzed. The specific process is as follows:

Step S201: to construct a DFIG integrated power system model.

Figure 4:
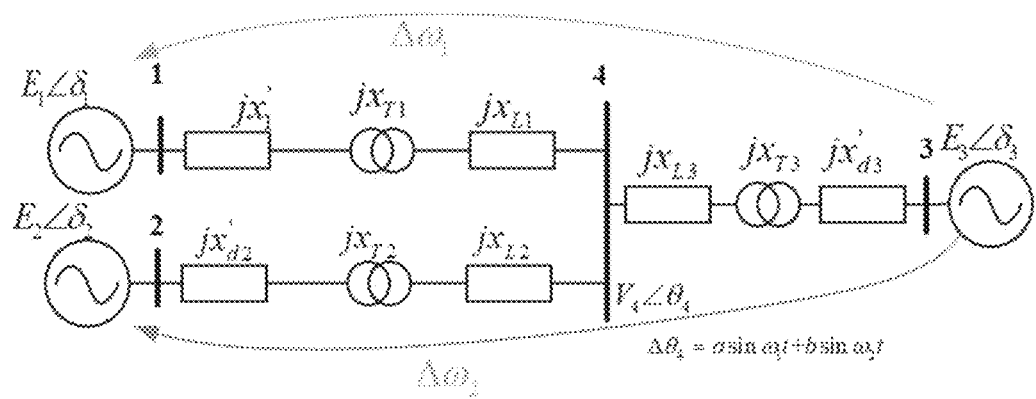
FIG. 4 is a model of DFIG integrated system in the embodiment.
Figure 5:
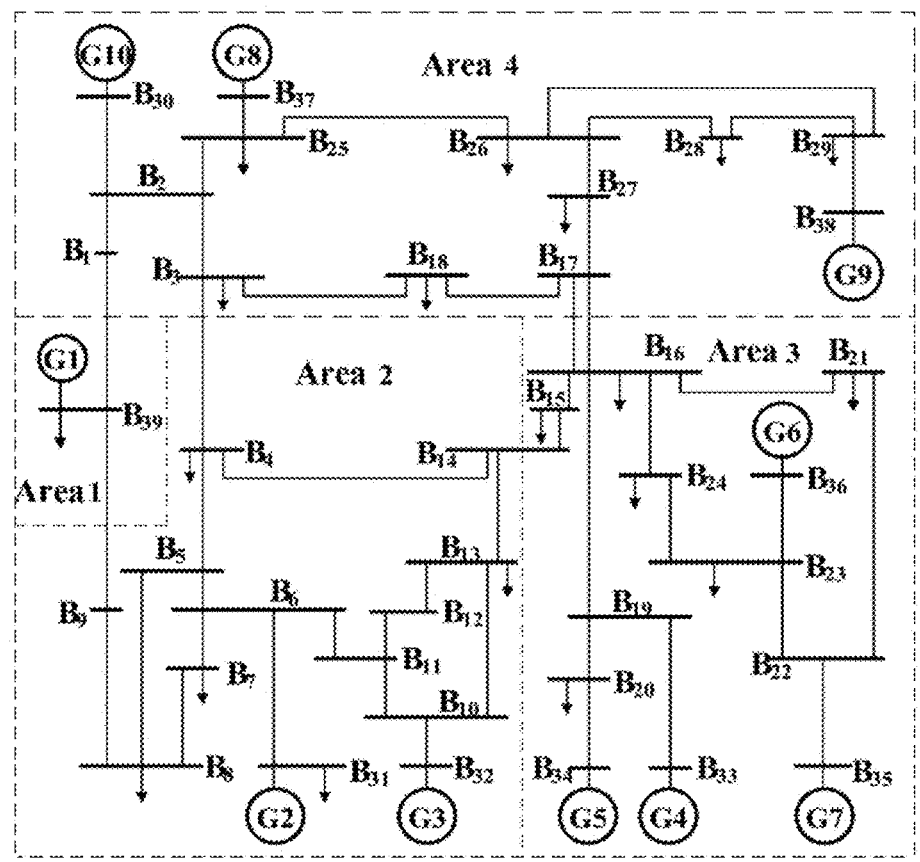
FIG. 5 is the IEEE 10-machine 39-bus system in the embodiment.

For the DFIG integrated system, there are two oscillation modes for low frequency oscillation, namely local oscillation mode and inter-region oscillation mode. Both of oscillation modes can be represented by relative oscillations between the two generator groups. As a result, in the application, an equivalent three-generator system is taken as an example to perform theoretical derivation of the energy spectrums, system structure is shown in FIG. 4, where G3 is the reference generator group. After disturbance occurs in the system, the oscillation mode generated between G1 and G3 is $\omega_1$, which is the dominant oscillation mode. G1 is the oscillation source generator group. The oscillation mode generated between G2 and G3 is $\omega_2$, which is the non-dominant oscillation mode. G2 is non-oscillation source generator group. The oscillation component generated by the phase angle of voltage at bus 4 is $\Delta\theta_4 = a \sin \omega_1 t + b \sin \omega_2 t$, where $a > b$.

Step S202: to derive the energy spectrums of synchronous generator(s), DFIG(s) with PLL, and DFIG(s) with virtual inertia as oscillation sources and non-oscillation sources.

(1) The energy spectrum expression when the synchronous generator is used as an oscillation source is:

$$\frac{F_1(\omega_1)}{F_1(\omega_2)} = \frac{(C_1+M_1)^2+(C_2+N_1)^2+\frac{a}{4}\sqrt{(C_1+M_1)^2+(C_2+N_1)^2}}{M_2^2+N_2^2+\frac{b}{4}\sqrt{M_2^2+N_2^2}}$$

$$= \frac{\sqrt{[C_1^2+C_2^2](d_1^2+b_1^2)+K_{D1}a(d_1C_1-b_1C_2)+(K_{D1}a)^2}+\frac{a}{4}}{K_{D1}b+\frac{b}{4}}.$$

$$\frac{\sqrt{[C_1^2+C_2^2](d_1^2+b_1^2)+K_{D1}a(d_1C_1-b_1C_2)+(K_{D1}a)^2}}{K_{D1}b}.$$

Where $C_1$, $C_2$, $M_1$, $N_1$, $M_2$ and $N_2$ are the coefficients of different amplitude components of power angle oscillation of G1, the expressions of which are respectively:

$$\begin{cases} C_1 = \Delta\delta_{10},\ C_2 = \dfrac{\Delta\omega_{10}-\alpha\Delta\delta_{10}}{\omega_1} \\ M_1 = -\dfrac{b_1 K_N a}{b_1^2+d_1^2},\ N_1 = \dfrac{d_2 K_N a}{b_1^2+d_1^2} \\ M_2 = -\dfrac{b_2 K_N b}{b_2^2+d_2^2},\ N_2 = \dfrac{d_2 K_N b}{b_2^2+d_2^2} \\ b_1 = K_{D1}\omega_1,\ d_1 = K_{s1}-M_1\omega_1^2 \\ b_2 = K_{D1}\omega_2,\ d_2 = K_{s1}-M_1\omega_2^2 \end{cases}$$

Where $K_D$, $K_S$ and $K_N$ are respectively:

$$\begin{cases} K_{D1} = D_1 \\ K_{s1} = E_1 E_2 B_{12} \cos \delta_{10} + E_1 V_3 B_{13} \cos(\delta_{10}-\theta_{40}). \\ K_{N1} = E_1 V_3 B_{13} \cos(\delta_{10}-\theta_{40}) \end{cases}$$

(2) The energy spectrum expression when the synchronous generator is used as a non-oscillation source is:

$$\frac{F_2(\omega_1)}{F_2(\omega_2)} = \frac{G_1^2+H_1^2+\frac{a}{4}\sqrt{G_1^2+H_1^2}}{(G_0+G_2)^2+(H_0+H_2)^2+\frac{b}{4}\sqrt{(G_0+G_2)^2+(H_0+H_2)^2}}$$

$$= \frac{K_{D2}a+\frac{a}{4}}{\sqrt{[G_0^2+H_0^2](m_1^2+n_1^2)+K_{D2}b(n_1 G_0-m_1 H_0)+(K_{D2}b)^2}+\frac{b}{4}}.$$

$$\frac{K_{D2}a}{\sqrt{[G_0^2+H_0^2](m_1^2+n_1^2)+K_{D2}b(n_1 G_0-m_1 H_0)+(K_{D2}b)^2}}.$$

Where $G_0$, $H_0$, $G_1$, $H_1$, $G_2$ and $H_2$ are the coefficients of different amplitude components of power angle oscillation of G2 respectively, the expressions of which are respectively:

$$\begin{cases} G_0 = \Delta\delta_{20}, H_0 = \dfrac{\Delta\omega_{20} - \alpha\Delta\delta_{20}}{\omega_2} \\ G_1 = -\dfrac{m_1 K_N a}{m_1^2 + n_1^2}, H_1 = \dfrac{n_1 K_N a}{m_1^2 + n_1^2} \\ M_2 = -\dfrac{m_2 K_N b}{m_2^2 + n_2^2}, N_2 = \dfrac{n_2 K_N b}{m_2^2 + n_2^2} \\ m_1 = K_{D2}\omega_1, n_1 = K_{s2} - M_2\omega_1^2 \\ m_2 = K_{D2}\omega_2, n_2 = K_{s2} - M_2\omega_2^2 \end{cases}$$

Where $K_{D2}$, $K_{S2}$ and $K_{N2}$ are respectively:

$$\begin{cases} K_{D2} = D_2 \\ K_{s2} = E_1 E_2 B_{12} \cos\delta_{20} + E_2 V_3 B_{13} \cos(\delta_{20} - \theta_{40}) \\ K_{N2} = E_2 V_3 B_{23} \cos(\delta_{20} - \theta_{40}) \end{cases}$$

(3) The energy spectrum expression when DFIG with PLL is used as an oscillation source is:

$$\dfrac{F_D(\omega_3)}{F_D(\omega_2)} = \dfrac{(A_0 + A_1)^2 + (B_0 + B_1)^2 + \dfrac{a}{4}\sqrt{(A_0 + A_1)^2 + (B_0 + B_1)^2}}{A_2^2 + B_2^2 + \dfrac{b}{4}\sqrt{A_2^2 + B_2^2}}$$

$$= \dfrac{\sqrt{\begin{array}{c}[A_0^2 + B_0^2](e_1^2 + f_1^2) + \\ K_p U_s a(f_1 A_0 - e_1 B_0) + (K_p U_s a)^2\end{array}} + \dfrac{a}{4}}{K_p U_s b + \dfrac{b}{4}}$$

$$\dfrac{\sqrt{[A_0^2 + B_0^2](e_1^2 + f_1^2) + K_p U_s a(f_1 A_0 - e_1 B_0) + (K_p U_s a)^2}}{K_p U_s b}$$

Where the expressions of $A_0$, $B_0$, $A_1$, $B_1$, $A_2$ and $B_2$ are respectively:

$$\begin{cases} A_0 = \Delta\delta_{pll0}, B_0 = \dfrac{\Delta\omega_{pll0} - \alpha\Delta\delta_{pll0}}{\omega_1} \\ A_1 = -\dfrac{e_1 K_t U_s a}{e_1^2 + f_1^2}, B_1 = \dfrac{f_1 K_t U_s a}{e_1^2 + f_1^2} \\ A_2 = -\dfrac{e_2 K_t U_s b}{e_2^2 + f_2^2}, B_2 = \dfrac{f_2 K_t U_s b}{e_2^2 + f_2^2} \\ e_1 = K_p U_s \omega_3, f_1 = K_t U_s - \omega_3^2 \\ e_2 = K_p U_s \omega_2, f_2 = K_t U_s - \omega_2^2 \end{cases}$$

(4) The energy spectrum expression when DFIG with virtual inertia is used as an oscillation source is:

$$\dfrac{F_D(\omega_3)}{F_D(\omega_2)} = \dfrac{(A_0 + A_1)^2 + (B_0 + B_1)^2 + \dfrac{a}{4}\sqrt{(A_0 + A_1)^2 + (B_0 + B_1)^2}}{A_2^2 + B_2^2 + \dfrac{b}{4}\sqrt{A_2^2 + B_2^2}}$$

$$= \dfrac{\sqrt{\begin{array}{c}[A_0^2 + B_0^2](e_1^2 + f_1^2) + \\ K_p U_s a(f_1 A_0 - e_1 B_0) + (K_p U_s a)^2\end{array}} + \dfrac{a}{4}}{K_p U_s b + \dfrac{b}{4}}$$

$$\dfrac{\sqrt{[A_0^2 + B_0^2](e_1^2 + f_1^2) + K_p U_s a(f_1 A_0 - e_1 B_0) + (K_p U_s a)^2}}{K_p U_s b}$$

Step S203: to analyze the energy spectrum characteristics of the synchronous generator(s), the DFIG(s) with PLL, and the DFIG(s) with virtual inertia as oscillation sources and non-oscillation sources.

In the energy spectrums of the synchronous generator, since $d_1^2 + b_1^2$ is proportional to $\omega_1^2$, and the magnitude of $d_1^2 + b_1^2$ is larger, but the magnitude of $K_{D1}$ is smaller, thus $[C_1^2 + C_2^2](d_1^2 + b_1^2) + K_{D1} a(d_1 C_1 - b_1 C_2) >> 0$, and the spectrum of the oscillation source generator of G1 satisfies:

$$\dfrac{F_1(\omega_1)}{F_1(\omega_2)} >> \dfrac{a^2}{b^2},$$

i.e. the energy amplitude of dominant frequency component is much larger than the energy amplitude of non-dominant frequency component.

The energy spectrum of the non-oscillation source of the synchronous generator satisfies:

$$\dfrac{F_2(\omega_1)}{F_2(\omega_2)} << \dfrac{a^2}{b^2},$$

i.e. the energy amplitude of dominant frequency component may be close to or smaller than the energy amplitude of non-dominant frequency component.

When the DFIG with PLL is used as an oscillation source, its energy spectrum is similar as the energy spectrum of the synchronous generator as the oscillation source, i.e. its energy amplitude of dominant frequency component is much larger than the energy amplitude of the other frequency components. When the DFIG is used as a non-oscillation source, its energy spectrum is similar to the energy spectrum of non-oscillation source of the synchronous generator, and significantly different from the energy spectrum of oscillation source generators.

The introduction of the virtual inertia will change the energy spectrum of DFIG, i.e. adding frequency coefficient $$\dfrac{\omega_3^2}{\omega_2^2}$$

to the amplitude of each energy component, thus the energy amplitudes of dominant oscillation mode and non-dominant oscillation mode cannot be estimated directly. Thus, an analogical energy spectrum is constructed in the application to eliminate the effect of frequency coefficient introduced by the virtual inertia. The analogical energy spectrum of DFIG $$\dfrac{F_{VI}(\omega_3)/f_3^2}{F_{VI}(\omega_2)/f_2^2}$$

can be obtained:

$$\frac{F_{VI}(\omega_3)/f_3^2}{F_{VI}(\omega_2)/f_2^2} = \frac{F_D(\omega_3)}{F_D(\omega_2)}$$

$$= \frac{\sqrt{[A_0^2 + B_0^2](e_1^2 + f_1^2) + K_p U_s a(f_1 A_0 - e_1 B_0) + (K_p U_s a)^2} + \frac{a}{4}}{K_p U_s b + \frac{b}{4}}$$

$$\frac{\sqrt{[A_0^2 + B_0^2](e_1^2 + f_1^2) + K_p U_s a(f_1 A_0 - e_1 B_0) + (K_p U_s a)^2}}{K_p U_s b}$$

The analogical energy spectrum of DFIG with virtual inertia has the same characteristics as the energy spectrum of DFIG with PLL. Therefore, there is significant difference between the analogical energy spectrums of oscillation source and non-oscillation source of the DFIGs with PLL and virtual inertia.

According to the above energy spectrum analysis, the energy spectrum characteristics of the oscillation source generators are: the energy amplitude of the dominant oscillation mode is much larger than the energy amplitude of the non-dominant oscillation mode. The energy spectrum characteristics of the non-oscillation source generator are: the energy amplitude of the dominant oscillation mode is close to or even smaller the energy amplitude of the non-dominant oscillation mode.

The First Embodiment

Based on the theoretical analysis, a method of locating oscillation sources of wind power integrated system based on energy spectrums in this embodiment is proposed, as shown in FIG. 1. It specifically includes the following steps:

Step 1: collecting the information of voltage U and current $I_G$ at the output terminal of each generator in the system and substituting them into equation (2) in order to obtain a dynamic energy curve of each generator over time.

Step 2: choosing the generators whose curve shows an upward trend in the dynamic energy curve over time into alternative generators, i.e. the negative damping generators are classified as the alternative generators.

Step 3: obtaining energy spectrums of synchronous generators, DFIGs with a phase-locked loop, and/or an analogical energy spectrum of DFIGs with virtual inertia among the alternative generators.

Through Fourier decomposition for the dynamic energy of each generator in the time domain, amplitudes A(k) of the energy spectrums corresponding to the frequency component f(k) can be obtained, where k=1, 2, 3, 4, ..., N/2, and N is a length of the discrete signal; A(k) is the amplitudes of energy spectrums for the synchronous generator and DFIG with PLL; the amplitudes of the analogical energy spectrum for the DFIG with virtual inertia are $A(k)/f^2(k)$.

The existence of the singular data in the amplitudes of energy spectrum will affect the accuracy of similarity analysis results. So, in order to eliminate the effect of noise in the data, the following formula is used to normalize the amplitudes of the energy spectrums and/or the amplitudes of the analogical energy spectrum:

$$S'(k) = \frac{S(k) - \overline{S}(k)}{\sqrt{\sum_{i=1}^{N/2} \frac{2}{N}[S_i(k) - \overline{S}(k)]^2}}.$$

Where S(k) is the amplitudes of energy spectrum corresponding to each frequency. The amplitudes of energy spectrums of the synchronous generators and the DFIG with PLL are S(k)=A(k). The amplitudes of analogical energy spectrum of the DFIG with virtual inertia are $S(k)=A(k)/f^2(k)$. $\overline{S}(k)$ is the average value of the amplitudes of energy spectrum. N is the number of frequencies. S'(k) is the normalized amplitudes of energy spectrum.

Step 4: after normalizing the amplitudes of the energy spectrum and/or the analogical energy spectrum, standardizing the amplitudes of the energy spectrums and/or the analogical energy spectrum to obtain the ratio of the amplitudes of energy spectrums of the oscillation modal and/or the amplitudes of analogical energy spectrum of each generator to the sum of the amplitudes of all the energy spectrum of the corresponding generators, wherein the generator with the largest proportion is the oscillation source reference generator.

The non-periodical component in dynamic energy may affect the amplitudes of energy spectrum of each oscillation mode. Since each generator has amplitudes of energy spectrums of multiple oscillation modes, in order to eliminate the effect of non-periodical component and facilitate the unified comparison of the amplitudes of the different oscillation mode spectrums, the amplitudes of all normalized energy spectrums and/or the analogical spectrum in the frequency range of low-frequency oscillations such as the 0.1 Hz-2.5 Hz frequency band are standardized. That is, the ratio of amplitudes of the energy spectrums and/or the analogical energy spectrum to the sum of amplitudes of all energy spectrums of the corresponding generator is calculated. The generator with the maximum proportion of dominant oscillation mode is selected from the alternative generators as the oscillation source reference generator.

Step 5: in the ±0.3 Hz frequency band of the dominant oscillation mode of the oscillation source reference generator, calculating the similarity coefficients between energy spectrums of each remaining alternative generator and the oscillation source reference generator, and determining the oscillation source generators based on the similarity coefficients.

$$r(X, Y) = \frac{n\Sigma xy - \Sigma x \Sigma y}{\sqrt{n\Sigma x^2 - (\Sigma x)^2} \cdot \sqrt{n\Sigma y^2 - (\Sigma y)^2}}.$$

where x, y are the energy spectrum data of the two generators under the dominant oscillation mode ±0.3 Hz; r is the calculated similarity coefficient.

By comparing the magnitude of the similarity coefficient r, if the energy spectrum similarity coefficient between a generator and the oscillation source reference generator is greater than or equal to 0.7±0.05, this generator is determined as the oscillation source generator, and if the energy spectrum similarity coefficient between a generator and the oscillation source reference generator is less than 0.7±0.05, this generator is determined as the non-oscillation source generator.

Compared with the present technologies, a method of locating the oscillation sources of wind power integrated system based on energy spectrums in the present embodiment, proposes a method of tracking low-frequency oscillation sources based on the similarity of the energy spectrum, according to the energy spectrum characteristics of the synchronous generator and the analogical energy spectrum characteristics of the DFIG, monitor in real time the dynamic energy variation curve of each generator during oscillation over time by measuring the voltage and current information at the terminal of each generator in the system, and identifies the alternative generators initially. After that, the online evaluation of the system damping and the online tracking of the conduction path of the oscillation components are realized. By comparing the similarity of the dynamic energy spectrum of different terminals of generators in the vicinity of the oscillation mode, it can avoid the influence of non-dominant oscillation mode on the location of the oscillation source, and realize the rapid and accurate identification of the dominant oscillation source generator under complex system operating conditions, which is helpful to isolate the fault generator in time, restrain the development and divergence of oscillation, and ensure the safe and stable operation of the system. Compared with the traditional method, the present application can avoid the influence of the non-dominant oscillation mode on the location of the oscillation sources when the system is excited with multiple oscillation modes after being disturbed, and achieve accurate identification of the oscillation source generator under complex system operating conditions.

The Second Embodiment

A system of locating oscillation sources of wind power integrated system based on energy spectrums is proposed in this embodiment, including data acquisition module, dynamic energy calculation module, energy spectrum analysis module and result output module. Wherein the data acquisition is implemented by sensors, for example, current sensor and voltage sensor, the dynamic energy calculation is implemented by a first processor, the energy spectrum analysis is implemented by a second processor, and the result output is implemented by the result output terminal. Each of the first processor and the second processor is independent processor, or both of them are integrated in a single processor.

The data acquisition module collects the information of voltage and current at the output terminal of each generator in the system and transfers them to the dynamic energy calculation module.

The dynamic energy calculation module receives the data transmitted by the data acquisition module, calculates a dynamic energy trend of each generator over time and transfers it to the energy spectrum analysis module.

The energy spectrum analysis module receives the dynamic energy data of the output terminal of each generator, calculates the energy spectrum and locates the system oscillation sources by comparing the similarity between the energy spectrums of each generator and the oscillation source reference generator.

The result output module is used for outputting a dominant oscillation mode and corresponding system oscillation source generators.

In this embodiment, the dynamic energy calculation module uses the following formula to calculate the dynamic energy change curve of each generator over time:

$$W = \int \text{Im}((-I^*_G)dU) = \int -P_e d\delta - \int I_d \dot{U}_q + \int I_q \dot{U}_d$$

Where $P_e$ is the active power output by the each generator. $\delta$ is the angular difference between xy coordinate system and dq coordinate system. When one of the plurality of generators is a synchronous generator, $\delta$ represents the power angle of the synchronous generator. $\delta$ represents the phase-locked angle $\delta_{pll}$ of PLL, when one of the plurality of generators is a DFIG with PLL. $\delta$ represents the phase-locked angle $\delta_{pll}$ of PLL, when one of the plurality of generators is a DFIG with virtual inertia. $U_d$, $U_q$, $I_d$ and $I_q$ are respectively the d-axis and q-axis components of the voltage and current at the output terminal of each generator.

In this embodiment, the working process of the energy spectrum analysis module is as follows:

To choose the generators whose curve shows an upward trend in the dynamic energy change curve over time into candidate generators (that is, alternative generators); to obtain energy spectrums of synchronous generators, DFIGs with a phase-locked loop, and/or an analogical energy spectrum of DFIGs with virtual inertia among the candidate generators; to standardize the amplitudes of the energy spectrums and/or the analogical energy spectrum, wherein the generator with the maximum proportion of dominant oscillation mode is selected as an oscillation source reference generator; to calculate the similarity coefficients of energy spectrum between each remaining candidate generator and the oscillation source reference generator in the ±0.3 Hz frequency band of the dominant mode of the oscillation source reference generator; and determine the oscillation source generators based on the similarity coefficients.

The system of locating the oscillation sources of wind power integrated system based on energy spectrums is provided by this embodiment, the energy spectrum analysis module receives the dynamic energy data of the output terminal of each generator, calculates the energy spectrum and by comparing the similarity between the energy spectrums of each generator and the oscillation source reference generator, it can quickly and accurately identify and locate the system oscillation sources, which realizes online identification of the oscillation sources and provides a strong guarantee for the stable and safe operation of the system. Since the principle of the system provided in the embodiment is the same as that of the method provided in the first embodiment, the system also has the corresponding technical effect of the above method embodiment.

The Third Embodiment

Figure 3:
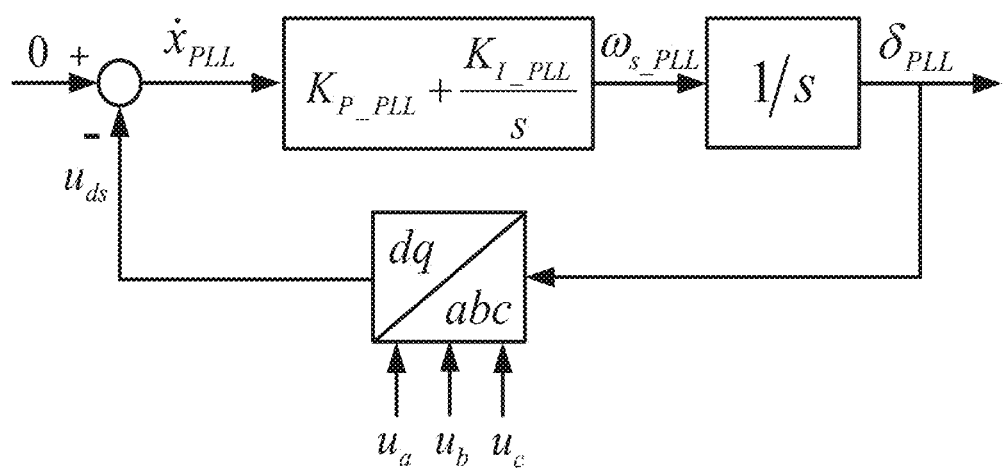
FIG. 3 is a block diagram of a typical virtual inertia control in the embodiment.

In this embodiment, the parallel equivalent model of DFIG is used to simulate the whole wind farm, and the locating method of the first embodiment is further verified. The New England 10 machine 39 node system diagram is shown in FIG. 3. The wind farm is composed of 1000 identical doubly fed asynchronous wind generator in parallel. The outlet of each wind generator is connected to the bus 39 to supply power to the power grid. The rated capacity of each generator is 1.5 MW, which operates at the rated output. The wind farm passes through the 0.69/20 kv transformer in the wind farm, and the 20/230 kV transformer to connect to bus 5 for power transmission, and the other generators are synchronous generators.

The scene set in this embodiment is that a small periodical disturbance with frequency of 0.48 Hz is set at the mechanical torque of DFIG at t=2s to excite the oscillation in power system, so that the active power of DFIG undergo a constant-amplitude oscillation with amplitude of approximately 43 kW.

Figure 6:
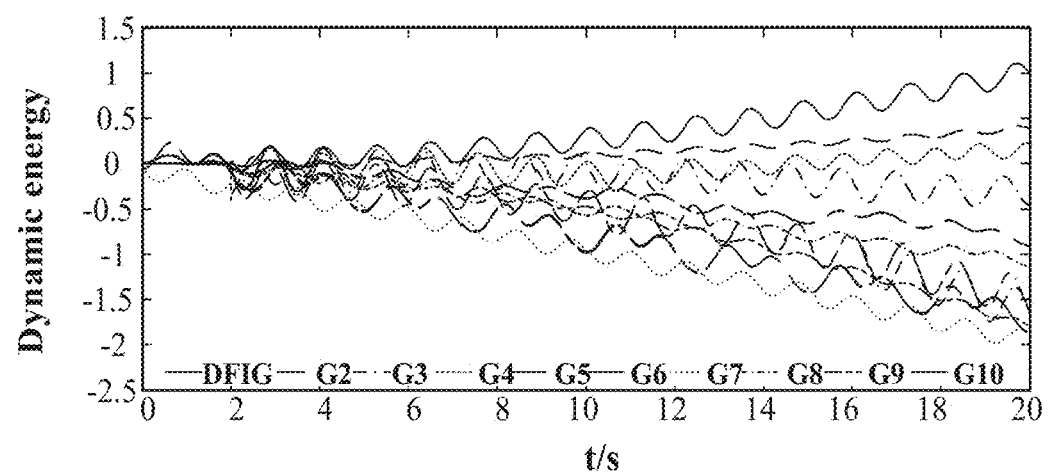
FIG. 6 is the variation curve of dynamic energy of each generator in the embodiment.

The dynamic energy calculation module operates, the results are as follows:

To measure the values of active power, phase angle, voltage and current at the terminal of each generator in the system and calculate the dynamic energy change curve of each generator during oscillation, as shown in FIG. 6. It can be seen that, the dynamic energy curves of DFIG, G2 and G4 all exhibit ascending trend, i.e. negative damping effect.

Figure 7:
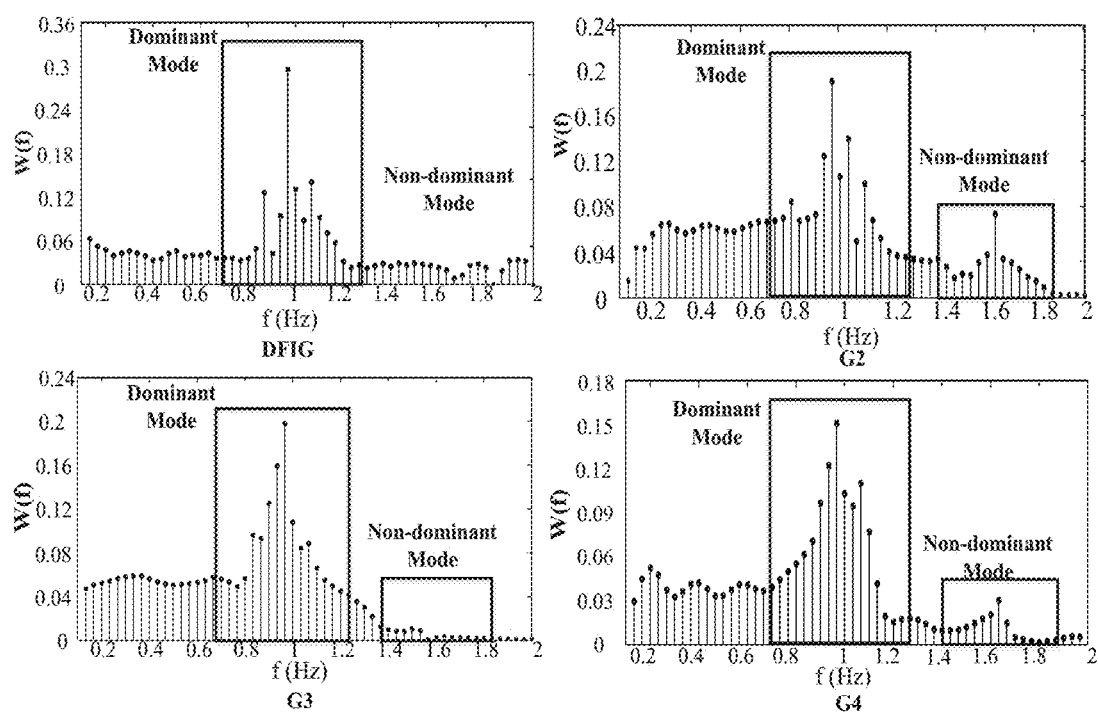
FIG. 7 is the energy spectrums of alternative generators in the embodiment.

The energy spectrum analysis module operates, and the results are as follows:

Three negative damping generators are divided into alternative generators and applied to Fourier transformation. The energy spectrums calculated and normalized is shown in FIG. 7, where DFIG uses the analogical energy spectrum for analysis. It can be seen in FIG. 7 that, the maximum energy spectrum of four generators all appear at twice oscillation frequency, i.e. 0.96 Hz. Meanwhile, comparing the energy spectrums of all generators at the selected frequency band, it can be seen that the proportion of DFIG dominant oscillation mode is the maximum, thus according to the characteristics of oscillation source energy spectrums, DFIG is identified as one of the oscillation source generators.

Figure 8:
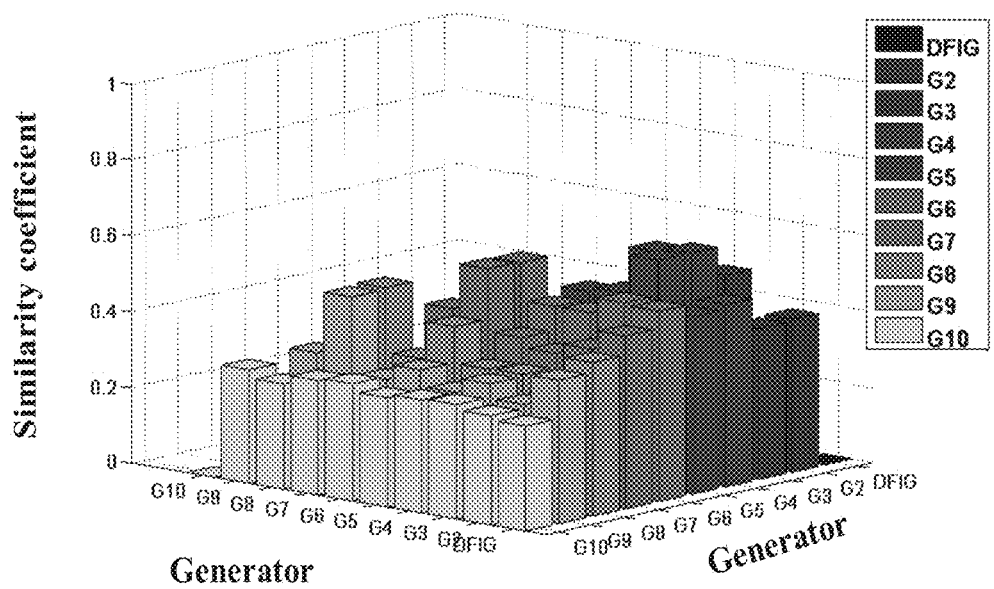
FIG. 8 is the histogram of similarity among energy spectrums of different generators in the embodiment.

To further verify whether the other generators are oscillation sources, the frequency band of dominant oscillation mode ±0.3 Hz is selected in this embodiment. According to the similarity formula, the values of similarity between energy spectrums of different generators are calculated. Since the similarity coefficient matrix is a real symmetric matrix, the data in the upper triangular part are used to depict the histogram of similarity, as shown in FIG. 8, where the similarity between a certain generator and itself is set to be 0 (which should be 1) to obtain better contrast effect. It can be seen in FIG. 8 that, in the selected frequency band, the similarity coefficients between energy spectrums of other generators and DFIG are all below 0.6, which means low correlation. Thus, only DFIG is the oscillation source in dominant oscillation mode, but not G2, G3 or G4.

To explore the new oscillation mode between G2 and G4 excited by the dominant oscillation mode, comparison is made between the energy spectrums of G2 and G4. It is found that, apart from the dominant frequency component, a non-dominant frequency component of about 1.64 Hz also exists between the two generators. Thus energy spectrum analysis in the frequency band of 1.64±0.3 Hz is further conducted. According to the proportion of 1.64 Hz frequency component in the energy spectrums of G2, G3 and G4, the proportion of this frequency component in the energy spectrum of G2 is the maximum. Thus, G2 is identified as one of the oscillation sources corresponding to the 1.64 Hz non-dominant oscillation mode. The calculated values of similarity between energy spectrums of G3, G4 and G2 in non-dominant frequency band are shown in Table I.

TABLE I

Similarity coefficients of energy spectrums of correlated generators

| Generator | G2 | G3 | G4 |
|---|---|---|---|
| G2 | 1 | 0.589 | 0.878 |
| G3 | 0.589 | 1 | 0.521 |
| G4 | 0.878 | 0.521 | 1 |

It can be seen in Table I, the similarity between energy spectrums of G4 and G2 is relatively high (0.878), while the similarity between energy spectrums of G3 and G2 in this frequency band is only 0.521. Thus, G2 and G4 are identified as oscillation sources in the non-dominant oscillation mode, which is inter-area oscillation excited by the forced oscillation. Though the dynamic energy curves of G2 and G4 exhibit ascending trend, i.e. generator damping is negative, they are not oscillation sources in the dominant oscillation mode. Thus, it is verified that, the method proposed in this application can locate oscillation source generators in the dominant oscillation mode accurately and effectively; while G2 and G4 may be mal-identified as oscillation source generators according to the variation trend of energy alone.

A non-transitory machine-readable storage medium comprising instructions that when executed cause a processor of a computing device to: collect information of voltage and current at an output terminal of each generator in the system; calculate a dynamic energy trend of each generator over time based on the information; calculate the energy spectrums, and locate the system oscillation source by comparing the similarity between the energy spectrums of each generator and the oscillation source reference generator; and output a dominant oscillation mode and corresponding system oscillation source generators.

The above is only a preferred embodiment of the application, but the scope of protection of the application is not limited to this. Any change or replacement that can be easily thought of by any person familiar with the technical field within the technical scope of the application shall be covered in the scope of protection of the application.

The foregoing descriptions of specific exemplary embodiments of the present application have been presented for purposes of illustration and description. They are not intended to be exhaustive or to limit the application to the precise forms disclosed, and obviously many modifications and variations are possible in light of the above teachings. The exemplary embodiments were chosen and described in order to explain certain principles of the application and their practical application, to thereby enable others skilled in the art to make and utilize various exemplary embodiments of the present application, as well as various alternatives and modifications thereof. It is intended that the scope of the application be defined by the Claims appended hereto and their equivalents.

What is claimed is:

1. A method of locating oscillation sources of wind power integrated system based on energy spectrums, comprising the following steps:
   step 1: collecting information of voltage and current at an output terminal of each of a plurality of generators in the wind power integrated system, and obtaining a dynamic energy curve of each of the plurality of generators over time;
   step 2: choosing alternative generators from the plurality of generators wherein curves of the alternative generators show an upward trend in the dynamic energy curve over time;
   step 3: obtaining an energy spectrum of a synchronous generator, an energy spectrum of a Doubly-fed induction generator (DFIG) with a phase-locked loop (PLL), and/or an analogical energy spectrum of a DFIG with virtual inertia among the alternative generators;
   step 4: standardizing, amplitudes A(k) of the energy spectrum of the synchronous generator and the energy spectrum of the DFIG with the phase-locked loop (PLL) and/or the analogical energy spectrum of the DFIG with virtual inertia, wherein a generator with maximum proportion of dominant oscillation mode is selected as an oscillation source reference generator; and step 5: calculating similarity coefficients between energy spectrums of each of remaining alternative generators and the oscillation source reference generator in a ±0.3 Hz frequency band of the dominant oscillation mode of the oscillation source reference generator; and determining oscillation source generators based on the similarity coefficients.

2. The method of locating the oscillation sources according to claim 1, wherein in the step 1, comprising calculating dynamic energy of each of the plurality of generators based on the following formula in order to obtain the dynamic energy curve of each of the plurality of generators over time:

$$W = \int \mathrm{Im}((-I^*_G)dU) = \int -P_e d\delta - \int I_d \dot{U}_q + \int I_q \dot{U}_d$$

wherein: $P_e$ is active power output by each of the plurality of generators, and $\delta$ is an angular difference between xy coordinate system and dq coordinate system;

when one of the plurality of generators is the synchronous generator, $\delta$ represents a power angle of the synchronous generator;

$\delta$ represents a phase-locked angle of PLL, when one of the plurality of generators is the DFIG with PLL;

S represents the phase-locked angle of PLL, when one of the plurality of generators is the DFIG with virtual inertia; and $U_d$, $U_q$, $I_d$ and $I_q$ are respectively d-axis and q-axis components of the voltage and current at the output terminal of each of the plurality of generators.

3. The method of locating the oscillation sources according to claim 1, wherein the step 3 comprising: through Fourier decomposition for dynamic energy of each of the plurality of generators in time domain, obtaining the amplitudes A(k) of energy spectrums that corresponds to frequency components f(k), where k=1, 2, 3, 4, . . . , N/2, and N is a length of a discrete signal, wherein the amplitudes A(k) of energy spectrums being a sum of the amplitudes of the energy spectrum of the synchronous generator and the energy spectrum of DFIG with PLL; and wherein the amplitudes of the analogical energy spectrum of the DFIG with virtual inertia being $A(k)/f^2(k)$.

4. The method of locating the oscillation sources according to claim 3, comprising normalizing the amplitudes A(k) of the energy spectrum of the synchronous generator and the energy spectrum of the DFIG with PLL and/or the analogical energy spectrum of the DFIG with virtual inertia, then standardizing the amplitudes of the energy spectrum of the synchronous generator and the energy spectrum of DFIG with PLL and/or the analogical energy spectrum of DFIG with virtual inertia based on the following formula; wherein the calculation formula of the normalization process is:

$$S'(k) = \frac{S(k) - \overline{S}(k)}{\sqrt{\sum_{i=1}^{N/2} \frac{2}{N} [S_i(k) - \overline{S}(k)]^2}}$$

where S(k) is the amplitude of energy spectrums corresponding to each frequency; the amplitudes of energy spectrums of the synchronous generator and the DFIG with PLL are S(k)=A(k); the amplitudes of analogical energy spectrum of the DFIG with virtual inertia is $S(k)=A(k)/f^2(k)$; $\overline{S}(k)$ is an average value of the amplitudes of energy spectrums; N is the number of frequencies; and S'(k) is the normalized amplitudes of energy spectrums.

5. The method of locating the oscillation sources according to claim 4, wherein the step 4 comprising standardizing all the normalized amplitudes S'(k) of the energy spectrum of the synchronous generator and the energy spectrum of DFIG with PLL and/or the amplitudes of the analogical energy spectrum of DFIG with virtual inertia in the 0.1 Hz-2.5 Hz to obtain a ratio of the amplitudes of the energy spectrums of each oscillation modal and/or the amplitudes of analogical energy spectrum of each of the plurality of generators to the sum of the amplitudes of all the energy spectrums of the corresponding generators; wherein the generator with the largest proportion is the oscillation source reference generator.

6. The method of locating the oscillation sources according to claim 1, wherein in the step 5, calculating the similarity coefficients between energy spectrums of each of the remaining alternative generators and the oscillation source reference generator according to the following formula:

$$r(X, Y) = \frac{n\Sigma xy - \Sigma x \Sigma y}{\sqrt{n\Sigma x^2 - (\Sigma x)^2} \cdot \sqrt{n\Sigma y^2 - (\Sigma y)^2}}$$

where x, y are respectively energy spectrum data of two generators under the dominant oscillation mode ±0.3 Hz; r is the calculated similarity coefficients.

7. The method of locating the oscillation sources according to claim 1, wherein in the step 5, when the similarity coefficients between energy spectrums of one of the remaining alternative generators and the oscillation source reference generator is greater than or equal to 0.7±0.05, the generator is determined as the oscillation source generator.

8. A system of locating oscillation sources of wind power integrated system based on energy spectrums, comprising: sensors, a first processor, a second processor and a result output terminal;

the sensors collect information of voltage and current at an output terminal of each of a plurality of generators in the wind power integrated system and transmit the collected information to the first processor;

the first processor receives the information transmitted by the sensors, and calculates a trend of dynamic energy of each of the plurality of generators over time and transfers the trend of dynamic energy to the second processor;

the second processor receives data of the dynamic energy output from the first processor, calculates the energy spectrums and locates system oscillation source by comparing similarities between the energy spectrums of each of the plurality of generators and an oscillation source reference generator, which further comprises the second processor configured to:

choose alternative generators from the plurality of generators, wherein curves of the alternative generators show an upward trend in the dynamic energy curve over time;

obtain energy spectrum of a synchronous generator and energy spectrum of a Doubly-fed induction generator (DFIG) with a phase-locked loop (PLL), and/or an analogical energy spectrum of DFIG with virtual inertia among the alternative generators;

standardize amplitudes A(k) of the energy spectrum of the synchronous generator and the energy spectrum of the DFIG with the PLL and/or the analogical energy spectrum of the DFIG with virtual inertia, wherein a generator with a maximum proportion of dominant oscillation mode is selected as the oscillation source reference generator;

calculate similarity coefficients between energy spectrums of each of remaining alternative generators and the oscillation source reference generator in a ±0.3 Hz frequency band of the dominant oscillation mode of the oscillation source reference generator; and determine oscillation source generators based on the similarity coefficients; and the result output terminal outputs a dominant oscillation mode of the oscillation source generators based on the similarities coefficients.

9. The system of locating the oscillation sources according to claim 8, wherein the first processor uses the following formula to calculate a dynamic energy change curve of each of the plurality of generators over time:

$$W = \int \text{Im}((-I^*_G)dU) = \int -P_e d\delta - \int I_d \dot{U}_q + \int I_q \dot{U}_d$$

where $P_e$ is active power output by each of the plurality of generators, and $\delta$ is an angular difference between xy coordinate system and dq coordinate system;

when one of the plurality of generators is the synchronous generator, $\delta$ represents a power angle of the synchronous generator;

$\delta$ represents a phase-locked angle of phase-locked loop (PLL), when one of the plurality of generators is the DFIG with the PLL;

$\delta$ represents the phase-locked angle of PLL, when one of the plurality of generators is the DFIG with virtual inertia; and $U_d$, $U_q$, $I_d$ and $I_q$ are respectively d-axis and q-axis components of the voltage and current at the output terminal of each of the plurality of generators.

10. A non-transitory machine-readable storage medium comprising instructions, when executed by a processor of a computing device, causes the computer to perform functions comprising:

collecting information of voltage and current at an output terminal of each of a plurality of generators in a system;

calculating a dynamic energy trend of each of the plurality of generators over time based on the information;

calculating energy spectrums, and locate oscillation sources of the system by comparing similarities between the energy spectrums of each of the plurality of generators and an oscillation source reference generator, wherein the comparing of the similarities further comprising:

choosing alternative generators from the plurality of generators, wherein curves of the alternative generators show an upward trend in the dynamic energy curve over time;

obtaining energy spectrum of a synchronous generator and energy spectrum of a Doubly-fed induction generator (DFIG) with a phase-locked loop (PLL), and/or an analogical energy spectrum of DFIG with virtual inertia among the alternative generators;

standardizing amplitudes A(k) of the energy spectrum of the synchronous generator and the energy spectrum of the DFIG with the PLL and/or the analogical energy spectrum of the DFIG with virtual inertia, wherein a generator with a maximum proportion of dominant oscillation mode is selected as an oscillation source reference generator;

calculating similarity coefficients between energy spectrums of each of remaining alternative generators and the oscillation source reference generator in a ±0.3 Hz frequency band of the dominant oscillation mode of the oscillation source reference generator; and determining oscillation source generators based on the similarity coefficients; and outputting a dominant oscillation mode of the oscillation source generators based on the similarities coefficients.

* * * * *